United States Patent
Väyrynen et al.

(10) Patent No.: US 7,532,680 B2
(45) Date of Patent: *May 12, 2009

(54) MULTI-MODE RADIO FREQUENCY TRANSMITTER

(75) Inventors: Jukka Väyrynen, Oulu (FI); Antti H. Rauhala, Kaarina (FI); Simo Murtojärvi, Salo (FI)

(73) Assignee: Nokia Corporation, Espoo (FI)

( * ) Notice: Subject to any disclaimer, the term of this patent is extended or adjusted under 35 U.S.C. 154(b) by 352 days.

This patent is subject to a terminal disclaimer.

(21) Appl. No.: 11/320,181

(22) Filed: Dec. 27, 2005

(65) Prior Publication Data

US 2006/0098617 A1    May 11, 2006

Related U.S. Application Data

(63) Continuation of application No. 10/656,403, filed on Sep. 4, 2003, now Pat. No. 7,010,057.

(51) Int. Cl.
*H04L 27/00* (2006.01)

(52) U.S. Cl. ............... 375/295; 375/135; 375/146; 375/305; 375/297; 375/311; 375/274; 375/308

(58) Field of Classification Search ............ 375/135, 375/146, 305, 297, 311, 274, 308
See application file for complete search history.

(56) References Cited

U.S. PATENT DOCUMENTS

| | | | |
|---|---|---|---|
| 5,068,833 A | 11/1991 | Lipschutz | 367/98 |
| 5,216,384 A | 6/1993 | Vanhecke | 330/279 |
| 5,276,917 A | 1/1994 | Vanhanen et al. | 455/89 |
| 5,551,067 A | 8/1996 | Hulkko et al. | 455/88 |
| 5,732,334 A | 3/1998 | Miyake | 455/126 |
| 6,617,927 B2 | 9/2003 | Numanami et al. | 330/277 |
| 6,765,443 B2 | 7/2004 | Pehike | 330/296 |
| 6,850,574 B2 | 2/2005 | Schwent et al. | 375/297 |
| 2003/0003886 A1 | 1/2003 | Kato et al. | 455/127 |
| 2003/0114124 A1 | 6/2003 | Higuchi | 455/126 |
| 2003/0160654 A1 | 8/2003 | Fischer et al. | 330/129 |
| 2003/0224743 A1 | 12/2003 | Okada et al. | 455/127.2 |
| 2004/0208157 A1 | 10/2004 | Sander et al. | 370/345 |
| 2005/0272397 A1* | 12/2005 | Sowlati | 455/326 |

* cited by examiner

*Primary Examiner*—Shuwang Liu
*Assistant Examiner*—Kabir A Timory
(74) *Attorney, Agent, or Firm*—Harrington & Smith, PC

(57) ABSTRACT

A method is disclosed to operate a multi-mode multi-timeslot RF transmitter, as is an RF transmitter that includes a control unit that operates in accordance with the method. The method includes, prior to a first timeslot, setting a plurality of control signals for the RF transmitter in accordance with a first modulation format used during the first timeslot; and during a guard period between the first timeslot and a next, temporally adjacent timeslot, setting the plurality of control signals for the RF transmitter in accordance with a second modulation format used during the second timeslot, where the first modulation format differs from the second modulation format.

31 Claims, 7 Drawing Sheets

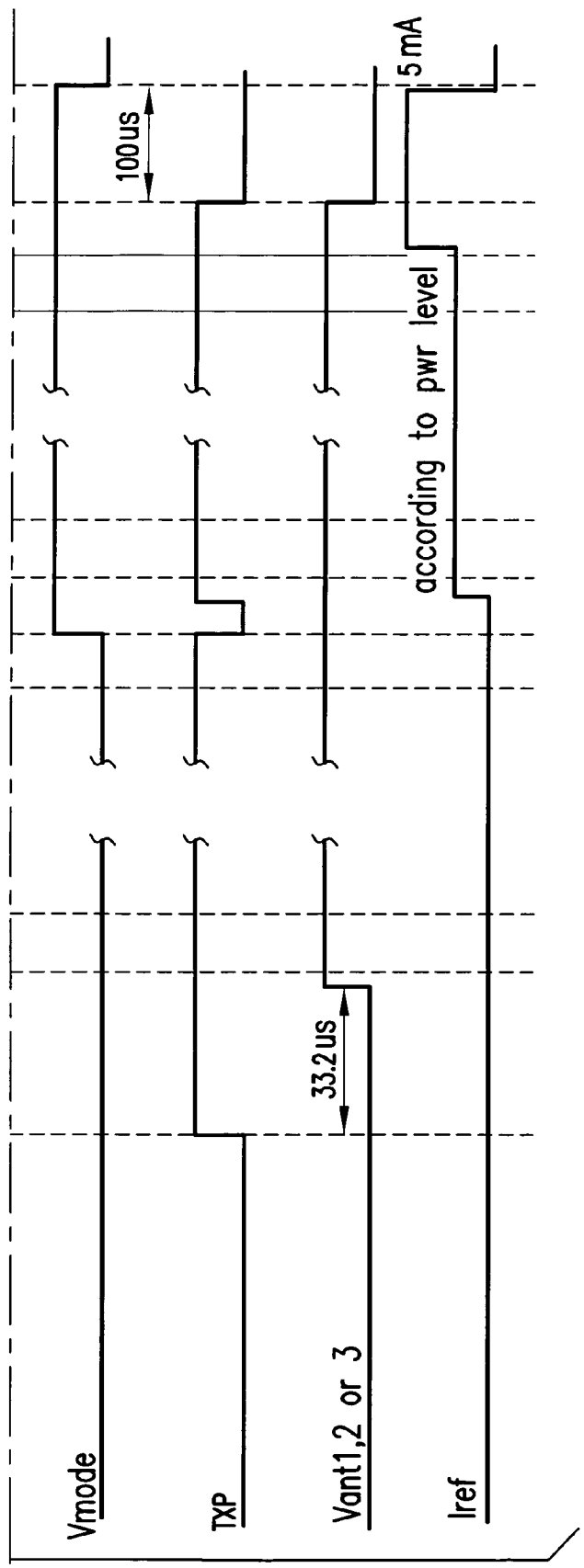

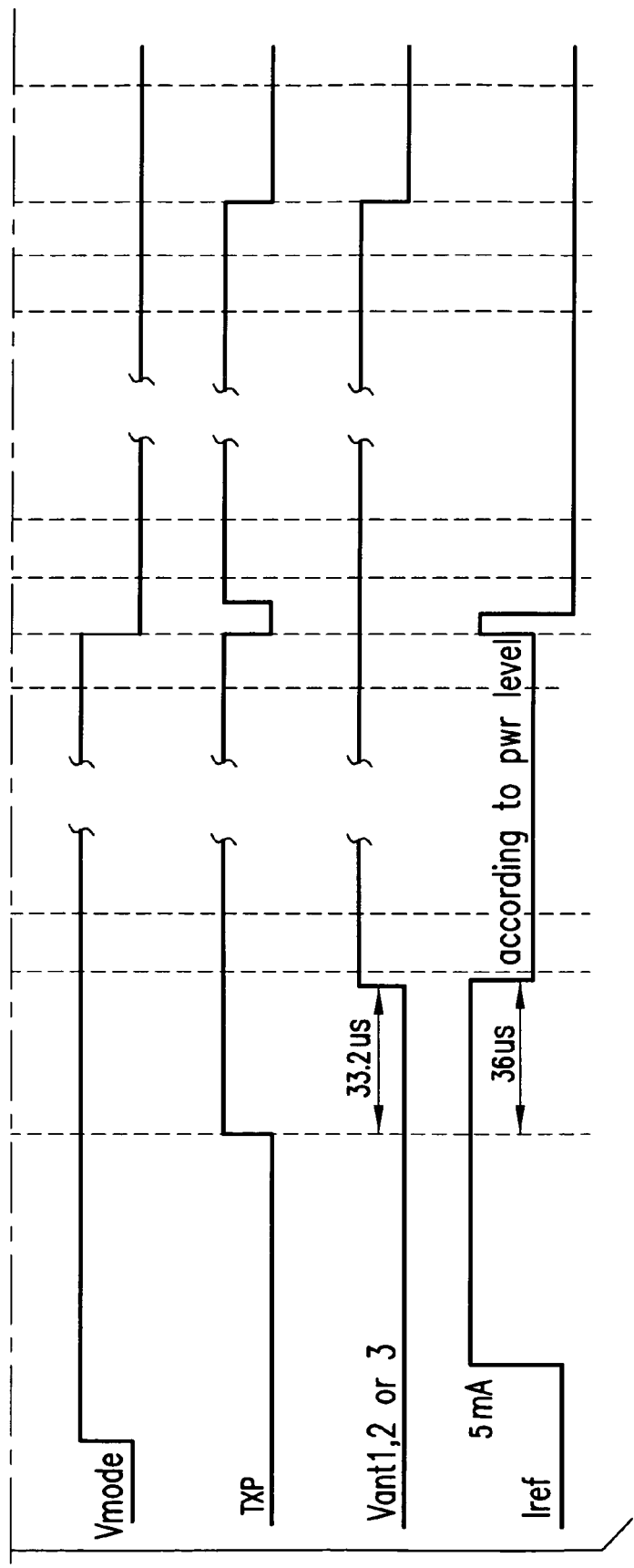

MULTI-MODE RADIO FREQUENCY TRANSMITTER

CROSS-REFERENCE TO A RELATED PATENT APPLICATION

This patent application is a continuation of U.S. patent application Ser. No. 10/656,403, filed on Sep. 4, 2003 now U.S. Pat. No. 7,010,057.

TECHNICAL FIELD

This invention relates generally to radio frequency (RF) transmitters and, more specifically, relates to dual mode radio frequency transmitters, such as those found in wireless voice and/or data telecommunications terminals, such as cellular telephones.

BACKGROUND

In one existing type of General Packet Radio System (GPRS), that uses only Gaussian Mean Shift Keying (GMSK) modulation, the transmitted power of a dual timeslot transmitter is changed directly from the power level of the first timeslot to the level of the second timeslot (i.e., there is no power ramping between adjacent timeslots).

However, in at least one proposed dual timeslot system known as Enhanced General Packet Radio Service (EGPRS), both GMSK and 8-PSK modulation is used, and the modulation sequence is changed from GMSK to 8-PSK, or vice versa, during the transition period. However, this approach would thus require that both timeslots are driven in the EDGE (Enhanced Data rate for Global Evolution) Mode, characterized by having fixed power amplifier (PA) gain power control, if at least one of the transmitted timeslots contains 8-PSK modulation. If only GMSK modulation is used in both timeslots, the transmitter would operate in the GMSK mode with a variable gain PA.

This approach would also set Iref according to the timeslot having the higher power level, and would drive the PA during both timeslots with a common value of Iref (Iref sets the PA quiescent current in the EDGE mode).

The inventors have realized that several problems can be experienced using the approach outlined above. A first problem relates to the available PA output power with the PA operated in the EDGE Mode with GMSK modulation. The GMSK power in the EDGE Mode is currently not defined in the PA specifications, and to operate the PA in the EDGE mode, with both GMSK and 8PSK modulation, would almost double the number of PA parameters that would need to be specified. With current commercially available PAs, that operate in the 850/900 MHz band, the power class drop to +29 dBm is a requirement, but to achieve this the transmit (TX) gain digital attenuator would need to be set to almost its minimum value to obtain the specification requirement of +26.5 dBm output power, in extreme conditions, with a safe margin. This TX gain attenuator setting difference also results in an additional tuning operation during manufacturing. In the 1800/1900 MHz band there is also a problem achieving +30 dBm power class (tolerance +/2, +/−2.5 in extremes), even with minimum TX gain attenuation. This may imply that the only possible solution in the 1800/1900 MHz band (GMSK) to reduce power is a class drop to +24 dBm.

A second problem relates to the production tuning operations, as they would be made more complicated if the same Iref value is used for both timeslots. For example, with the maximum Iref value all TX power levels need to be tuned, with the middle Iref value two thirds of the power levels would have to be re-tuned, and one third of the power levels would be required to be tuned three times. In addition, all of the required tuning tables would need to be saved in the software of the mobile station.

A third problem relates to avoiding discontinuities in the TX Inphase and Quadrature phase (I/Q) signals to ensure a smooth power transition between the 8-PSK and GMSK (and vice versa) time slots.

A fourth problem arises from the use of the same value of Iref for both timeslots, as this causes poor efficiency in the timeslot having the lower TX power level.

A fifth problem arises from the power detector sensitivity of the at least some commercially available PAs. The PA power detector in essence loses sensitivity with a maximum Iref at +19 dBm, which means that the operation of the power control loop is impaired with power levels below that value.

SUMMARY OF THE PREFERRED EMBODIMENTS

The foregoing and other problems are overcome, and other advantages are realized, in accordance with the presently preferred embodiments of these teachings.

In accordance with a presently preferred dual mode EGPRS transmitter system embodiment, all RF controls are changed between adjacent TX timeslots according to the modulation type of the next timeslot, including the transmitter mode. As a result, optimized controls for each of GMSK (variable gain PA) and 8-PSK (fixed gain PA) single slot operation can be used in the multi-slot operation, without compromising radio frequency performance. This includes full GMSK/EDGE power, and optimum efficiency for both independent timeslots. Output power ramping is employed between two adjacent timeslots.

In accordance with the presently preferred dual mode EGPRS transmitter embodiment, all of the radio frequency controls that would be used in a single timeslot GMSK, and in a single timeslot 8-PSK transmitter, are used in the multi-slot transmission mode. The RF settings are changed during a guard period between adjacent timeslots. For example, the PA operating mode includes the bias voltages, the power control method (fixed gain PA to variable gain PA), and the characteristics of the power control loop are changed during the guard period so as to be appropriate for the modulation type of the next timeslot.

In this presently preferred dual mode solution, there are no compromises made during multi-slot operation. That is, the RF performance of independent time slots is equivalent to that which can be achieved when operating with a fully optimized single timeslot.

In addition, the production tuning procedures used with a conventional single timeslot transmitter can be used in the multi-slot case, thereby eliminating the complexity and additional expense of performing additional multi-slot tuning procedures during production.

In the presently preferred dual mode multi-slot operation the TX power is ramped between adjacent timeslots to avoid power transients when switching the PA mode, the power control loop, and so forth, during the transition period.

A method is disclosed to operate a dual mode multi-timeslot RF transmitter, as is an RF transmitter that includes a control unit that operates in accordance with the method. The method includes, prior to a first timeslot, setting a plurality of control signals for the RF transmitter in accordance with a first modulation format used during the first timeslot; and during a guard period between the first timeslot and a next, temporally adjacent timeslot, setting the plurality of control signals for the RF transmitter in accordance with a second modulation format used during the second timeslot, where the first modulation format differs from the second modulation format.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 1A shows the configuration of the multi-slot transmitter in the GMSK case with a variable gain PA, and FIG. 1B shows the configuration of the multi-slot transmitter in the 8PSK case with a fixed gain PA;

DETAILED DESCRIPTION OF THE PREFERRED EMBODIMENTS

Figure 1A:
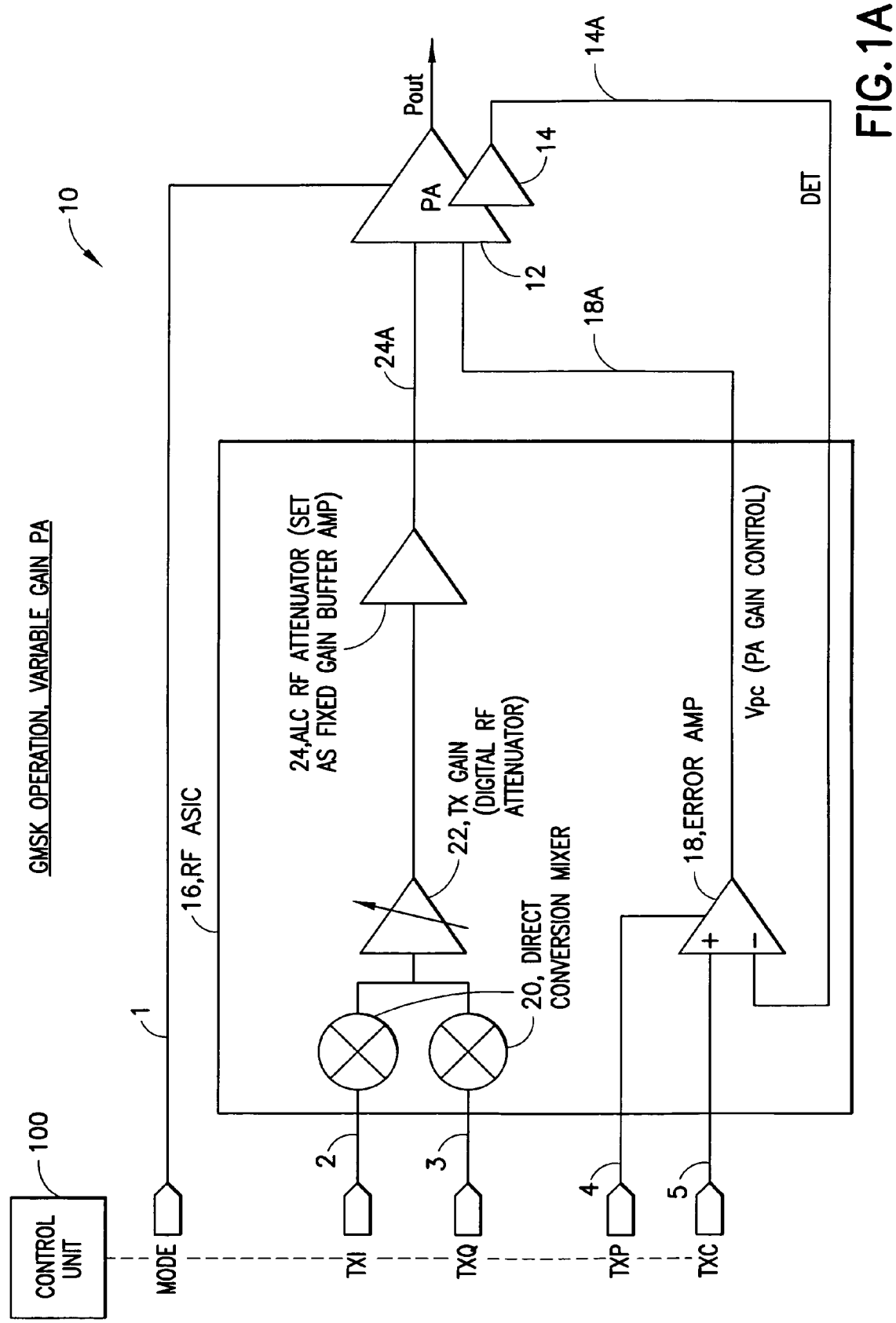
FIGS. 1A and 1B, collectively referred to as FIG. 1, show a simplified block diagram of a multi-slot transmitter in accordance with this invention, where
Figure 1B:
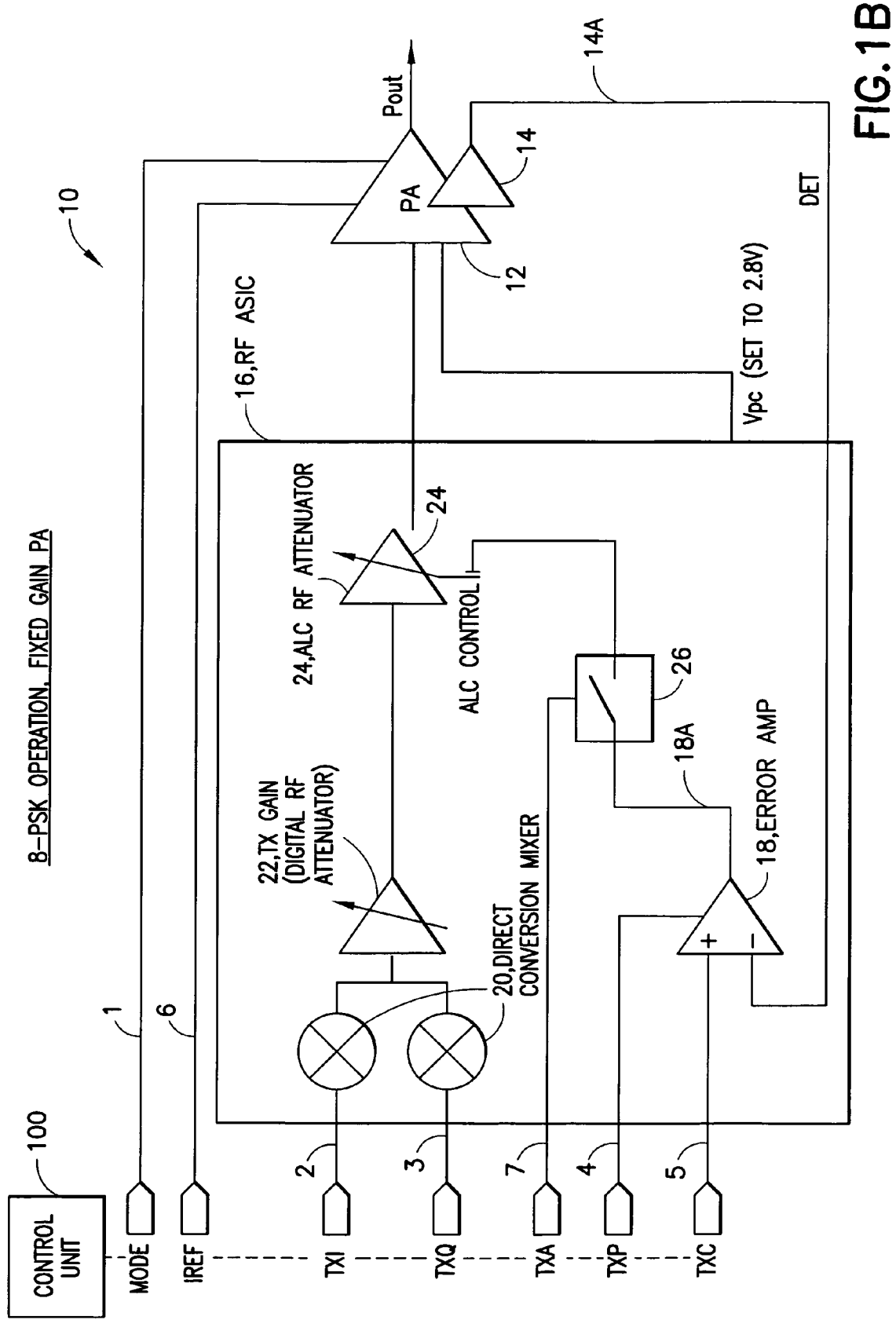

FIG. 1 is a simplified block diagram of a multi-slot transmitter (MST) 10 in accordance with this invention, where FIG. 1A shows the configuration of the multi-slot transmitter in the GMSK slot case with a variable gain PA 12, and FIG. 1B shows the configuration of the multi-slot transmitter in the 8PSK slot case with the PA 12 operated in the fixed gain mode. An output power detector 14 provides a power detection signal (DET) 14A to an RF block, here implemented for convenience in an RF ASIC 16. The DET signal 14A is applied to one input of an error amplifier 18. The RF ASIC 16 also includes an I/Q modulator portion implemented as a direct conversion mixer 20 having an output that is fed to a digital RF attenuator (TX_gain) 22. The output of TX_gain 22 is input to an ALC RF attenuator 24 that, in the embodiment of FIG. 1A, is operated as a fixed gain buffer amplifier, and in the embodiment of FIG. 1B is operated as a variable RF attenuator controlled by an ALC signal 18A that is output from the error amplifier 18, and selectively applied through a switch 26. In the embodiment of FIG. 1A the error amplifier output signal 18A is referred to as Vcntrl or Vpc (shown in FIGS. 2, 3 and 4), and is applied to the PA 12 for controlling its gain. Input signals include a Mode signal 1 (shown as Vmode in FIGS. 3 and 4), the I and Q input signals to be transmitted (TXI 2 and TXQ 3), TXP 4 and TXC 5 that are applied to the error amplifier 18 (both shown in FIGS. 3 and 4), and for the case of the fixed gain PA 12 embodiment of FIG. 1B, an IREF signal 6 and a TXA signal 7 (both shown in FIGS. 3 and 4). TXA 7 controls the state of the switch 26 and during the power ramping period in the 8-PSK mode is asserted low (see FIGS. 3 and 4) to close switch 26, thereby applying the output of the error amplifier 18 to the control input of the ALC RF attenuator 24. During the active portion of the 8-PSK timeslot, TXA 7 is driven high to open switch 26, thereby avoiding amplitude cancellation caused by the closed power control loop. TXP 4 is an enabling signal for the error amplifier 18, and in FIG. 3 can be seen to be active during both the GMSK and 8-PSK slots, and to be deasserted (low) during the guard time between slots. The mode signal 1, when low, places the PA 12 into the variable gain mode of operation, and when high places PA 12 into the fixed gain mode of operation (where IREF sets the PA 12 quiescent current). The TXC (transmit control) signal 5 is varied to control the output power level, either via the Vpc signal 18A in the variable gain PA 12 mode of FIG. 1A, or via the ALC control applied to the ALC RF attenuator 24 in the fixed gain PA 12 mode of FIG. 1B. The TXC signal is ramped during the guard time between the GMSK and 8-PSK slots, as can be seen in FIGS. 3 and 4.

Preferably all RF control signals settings are changed during the guard period between adjacent timeslots. This changes the PA 12 operating Mode, including bias voltages, the power control method (from fixed gain PA 12 to variable gain PA 12), and the power control loop from DET 14 to the error amplifier 18, and from the error amplifier 18 to either the PA 12 or the ALC RF attenuator 24, via the Vpc or the ALC control signal, respectively. Changing the PA Mode 1 between timeslots ensures full power operation for the GMSK timeslot.

Figure 2:
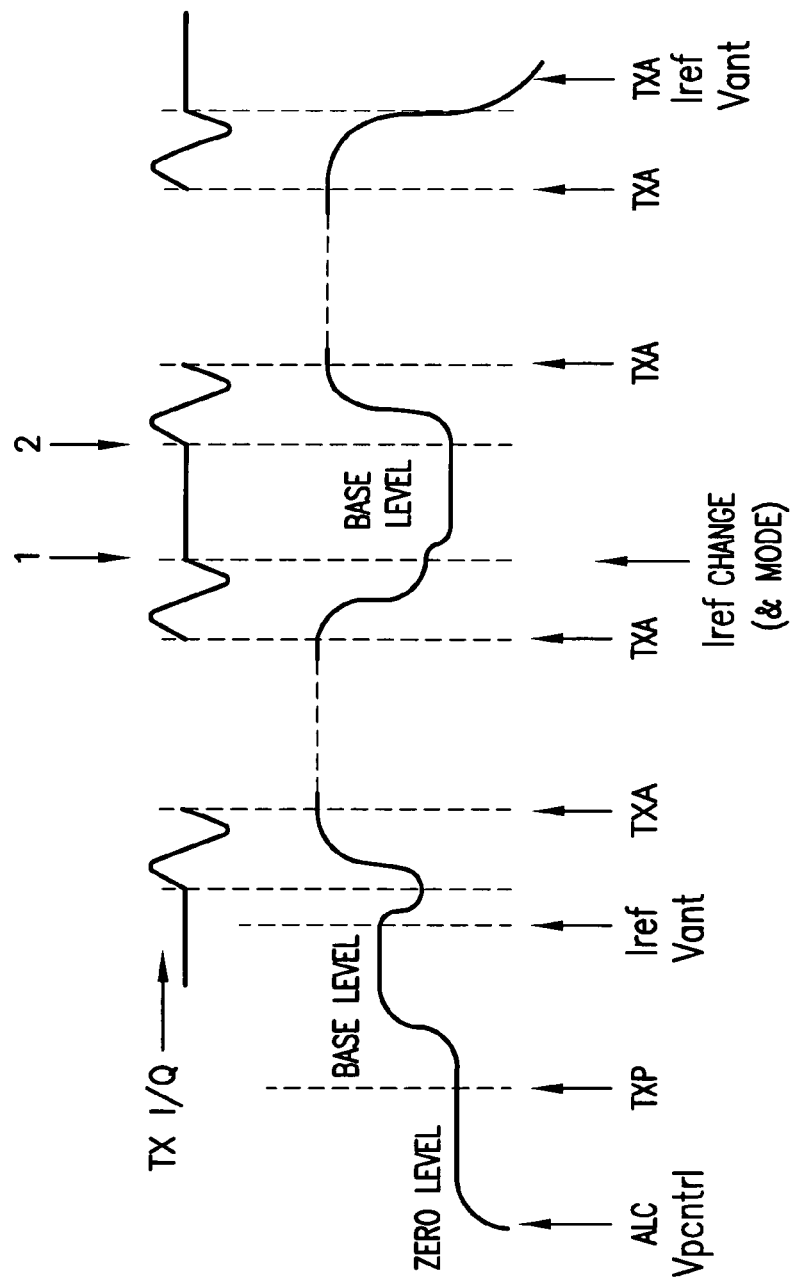
FIG. 2 is a basic timing diagram that illustrates the multi-slot operation of the multi-slot transmitter of FIG. 1.

In the embodiment shown in FIG. 1B and FIG. 2 the TXA 7 and Iref 6 signals are used only for the EDGE timeslot (only for the 8-PSK modulation case), and both Iref 6 and Mode 1 are changed between timeslots. In addition, the Vpc signal is used for GMSK modulation and the ALC control signal is used for 8-PSK modulation.

Figure 3A:
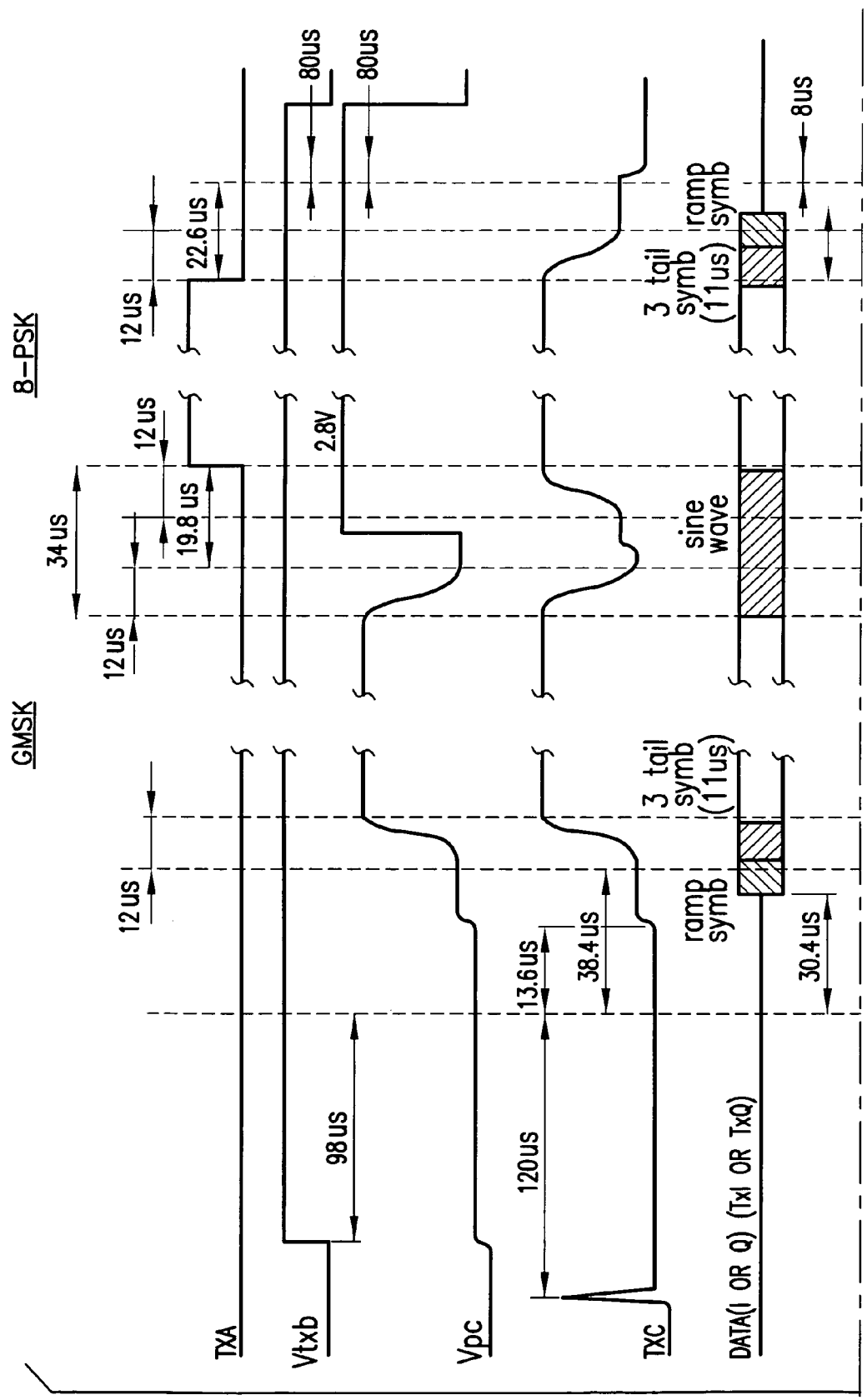
FIG. 3 is a more detailed timing diagram that shows the transition of a plurality of RF control signals when going from a GMSK timeslot to an 8-PSK timeslot.
Figure 4A:
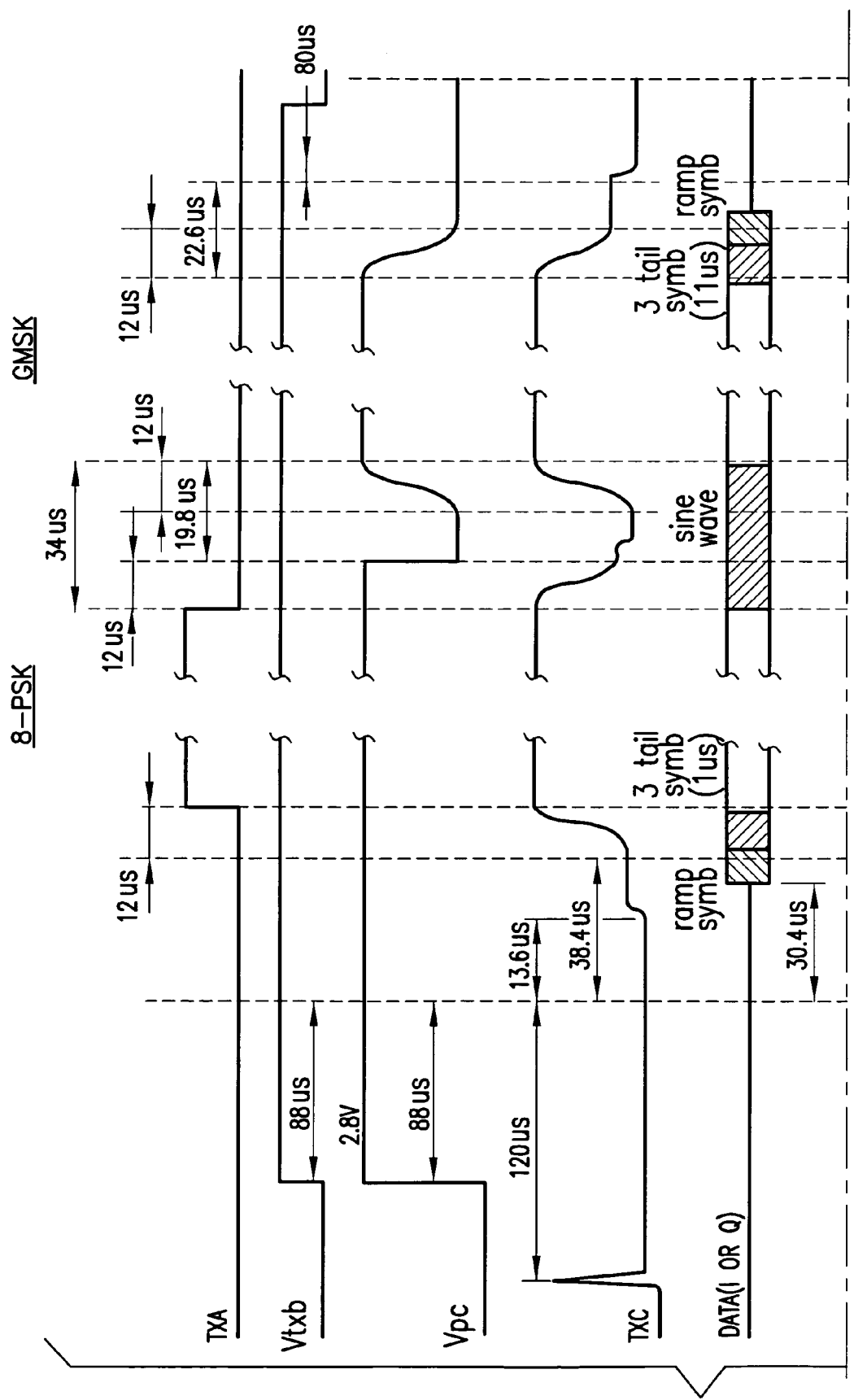
FIG. 4 shows the transition of the plurality of RF control signals when going from an 8-PSK timeslot to a GMSK timeslot.

Note that in FIGS. 3 and 4 the TX I/Q may be made a constant sine wave during the Iref (and Mode) change, to avoid power spikes that would result in a spreading of the output spectrum. However, this is not necessary, as the output power is ramped down before switching Iref 6 and Mode 1.

At the points labeled 1 and 2 in FIG. 2, the falling ramp of the first time slot (GMSK or 8-PSK) is ramped down to the base level. At Point 1 the Mode 1 and Iref 6 signals are set according to the requirements of the next timeslot, and the base level of the next timeslot is written (TXC, shown in FIGS. 3 and 4). The base level voltage is assumed to have sufficient time to settle before Point 2. As a result, all dual-slot rising and falling power ramps (GMSK and 8-PSK) operate in a manner that is similar to the conventional single timeslot case.

In the preferred embodiment the time between two adjacent timeslots is 34.13 microseconds (corresponding to 9.25 symbols, tail bits not included). For the timing between two timeslots the TXC ramp up/down time is about 12 microseconds, and the time between Points 1 and 2 in FIG. 2 is about 10 microseconds.

Referring also to FIG. 3, preparation for the first timeslot is performed as in the conventional single timeslot case. That is, TXC 5 is raised first to the base level, followed TXC 5 ramp up. The RF controls are thereafter operated similar to the single timeslot case until the falling ramp of the first timeslot. The falling ramp of the first timeslot (the GMSK slot in this example) is ramped down to it's base level. At this time the PA Mode 1 is changed to EDGE, TXP 4 is deasserted (goes low), and the base level of the next timeslot is written (TXC). Note that in FIG. 1B (8-PSK operation) Vpc is set to 2.8V (if needed by the PA 12), and the ALC voltage controls the power level.

There are three commands issued to the RF ASIC 16 (such as over an RF ASIC serial bus interface, not shown) during the guard period. These commands are used for controlling Vpc, changing the power control loop, shutting down the buffer mode and setting the proper TX gain with the digital attenuator 24. In addition, Vpc is set to 2.8V in the EDGE mode.

After these commands are issued during the guard period, TXP 4 is raised, Iref 6 is adjusted according to the needs of the next timeslot and the rise in the TXC ramp for the next timeslot is started.

At the end of second timeslot, Iref is set to some value, such as 5 mA, to ensure PA 12 stability after an antenna switch opens (controlled by Vant). After the antenna switch control signal opens the antenna switch, other PA 12 control voltages (VTXP, Vpc) are turned off.

Referring to FIG. 4, as in the case of FIG. 3 the preparation for first timeslot can be performed as in the conventional single timeslot case. Iref 6 is raised to some predetermined value, such as 5 mA, before the Vant control signal is asserted to ensure PA 12 stability. TXC 5 is then raised first to the base level, followed by TXC ramp up. The control signal operation is then similar to the single EDGE (8-PSK) timeslot case until the falling ramp of the first timeslot. The falling ramp of the first time slot is ramped down to the base level, the PA 12 Mode is changed to GMSK, TXP 4 is deasserted, and the base level of the next timeslot is written (TXC 5). During the guard period Iref 6 is set to the predetermined level (e.g., 5 mA) for a short while to avoid spikes in RF power. TXP 4 is then raised and TXC 5 is ramped up for the next timeslot to be started.

As is shown in FIGS. 1A and 1B, a control unit 100 is provided for changing the states of the various control signals as discussed above and shown in FIGS. 2, 3 and 4. The control unit 100 may be implemented with state machine logic, with a programmed microcontrol unit, or by any suitable means.

It should be noted that the control logic can differ between PAs 12 provided by different suppliers. For example, one conventional PA does not require 2.8V Vpc voltage in the EDGE mode, and the Iref logic has the opposite sense to that shown in the drawings. Thus, the specific signal levels and transitions shown in FIGS. 3 and 4 are exemplary, as those skilled in the art will recognize that modifications may need to be made depending on the type of PA 12 that is selected for use in a given application. Further, this invention is not limited for use only with 8-PSK and GMSK modulation formats, and furthermore is not to be considered to be limited by the specific timing relationships, timing values and signal levels depicted in FIGS. 3 and 4.

Thus, while this invention has been shown and described in the context of certain presently preferred embodiments thereof, it is expected that those skilled in the art may derive various modification to these embodiments when guided by the foregoing description of the invention. However, all such modifications will still fall within the scope of this invention.

What is claimed is:

1. A method, comprising:
   prior to a first timeslot, setting a plurality of control signals for a multi-mode radio frequency transmitter in accordance with a first modulation format used during the first timeslot; and
   during a guard period between the first timeslot and a next, temporally adjacent timeslot, setting the plurality of control signals for the multi-mode radio frequency transmitter in accordance with a second modulation format used during the next temporally adjacent timeslot,
   where the first modulation format differs from the second modulation format,
   where one of the plurality of control signals is configured to be sent to a variable gain element comprising an output that is configured to be connectable with an input of a power amplifier,
   where one of the plurality of control signals is configured to set a power amplifier mode of operation, and
   where the mode of operation is one of a variable gain power amplifier and a fixed gain power amplifier.

2. The method as in claim 1, where one of the plurality of control signals is configured to set a power amplifier quiescent current.

3. The method as in claim 1, where at least one of the plurality of control signals is configured to control power amplifier gain.

4. The method as in claim 1, where one of the modulation formats operates with a variable gain power amplifier and the other of the modulation formats operates with a fixed gain power amplifier,
   where one of the plurality of control signals is configured to set the power amplifier gain and to ramp the power amplifier gain during the guard period.

5. The method as in claim 1, where one of the modulation formats is 8-PSK, and where the other of the modulation formats is GMSK.

6. An radio frequency transmitter, comprising:
   a programmable power amplifier comprising an input configured to be connectable with an output of a variable gain amplifier; and
   a multi-mode, multi-timeslot control unit configured to output control signals, said multi-mode, multi-timeslot control unit configured, prior to a first timeslot, to set a plurality of control signals for the radio frequency transmitter in accordance with a first modulation format used during the first timeslot and, during a guard period between the first timeslot and a next, temporally adjacent timeslot, to set the plurality of control signals for the radio frequency transmitter in accordance with a second modulation format used during the next temporally adjacent timeslot,
   where the first modulation format differs from the second modulation format,
   where the control unit is further configure to send one of the plurality of control signals to the variable gain amplifier,
   where one of the plurality of control signals is configured to set a programmable power amplifier mode of operation, and
   where the mode of operation is one of variable gain and fixed gain.

7. The radio frequency transmitter as in claim 6, where one of the plurality of control signals is configured to set a power amplifier quiescent current.

8. The radio frequency transmitter as in claim 6, where at least one of the plurality of control signals is configured to control the gain of the power amplifier.

9. The radio frequency transmitter as in claim 6, where one of the modulation formats operates with the power amplifier in a variable gain mode and the other of the modulation formats operates with the power amplifier in a fixed gain mode,
   where one of the plurality of control signals is configured to set the programmable power amplifier gain mode and said control unit is configured to ramp the power amplifier gain during the guard period.

10. The radio frequency transmitter as in claim 6, where one of the modulation formats is 8-PSK, and where the other of the modulation formats is GMSK.

11. An apparatus, comprising a multi-mode multi-timeslot radio frequency transmitter comprising a programmable power amplifier comprising an input configured to be connectable with an output of a variable gain amplifier and a control unit configured to output control signals, said control unit configured, prior to a first timeslot, to set a plurality of control signals for the multi-mode, multi-timeslot radio frequency transmitter in accordance with a first modulation format used during the first timeslot and, during a guard period between the first timeslot and a next, temporally adjacent timeslot, to set the plurality of control signals for the multimode, multi-timeslot radio frequency transmitter in accordance with a second modulation format used during the next temporally adjacent timeslot, where the first modulation format differs from the second modulation format, where the control unit is further configure to send one of the plurality of control signals to the variable gain amplifier, where one of the plurality of control signals is configured to set a programmable power amplifier mode of operation, and where the mode of operation is one of variable gain and fixed gain.

12. The apparatus as in claim 11, where one of the plurality of control signals is configured to set a quiescent current of the programmable power amplifier.

13. The apparatus as in claim 11, where at least one of the plurality of control signals is configured to control the gain of the programmable power amplifier.

14. The apparatus as in claim 11, where one of the modulation formats operates with the programmable power amplifier in a variable gain mode and the other of the modulation formats operates with the programmable power amplifier in a fixed gain mode, where one of the plurality of control signals is configured to set the programmable power amplifier gain mode and said control unit is configured to ramp the power amplifier gain during the guard period.

15. The apparatus as in claim 11, where one of the modulation formats is 8-PSK, and where the other of the modulation formats is GMSK.

16. An radio frequency transmitter comprising programmable power amplifier means comprising input means configured to be connectable with output means of a variable gain means and control means for outputting control signals, said control means, prior to a first timeslot, for setting a plurality of control signals for the radio frequency transmitter in accordance with a first modulation format used during the first timeslot and, during a guard period between the first timeslot and a next, temporally adjacent timeslot, for setting the plurality of control signals for the radio frequency transmitter in accordance with a second modulation format used during the next temporally adjacent timeslot, where the first modulation format differs from the second modulation format, where the control means is further for sending one of the plurality of control signals to the variable gain means, where one of the plurality of control signals is configured to set a mode of operation of the programmable power amplifier means, and where the mode of operation is one of variable gain and fixed gain.

17. The radio frequency transmitter as in claim 16, where one of the plurality of control signals is configured to set a quiescent current of the programmable power amplifier means, and where at least one of the plurality of control signals is configured to control the gain of the programmable power amplifier means.

18. The radio frequency transmitter as in claim 16, where one of the modulation formats operates with the programmable power amplifier means in a variable gain mode and the other of the modulation formats operates with the programmable power amplifier means in a fixed gain mode, where one of the plurality of control signals is configured to set the gain mode of the programmable power amplifier means and said control means is configured to ramp the power amplifier gain during the guard period.

19. The radio frequency transmitter as in claim 16, where one of the modulation formats is 8-PSK, and where the other of the modulation formats is GMSK.

20. The method as in claim 1, where said radio frequency transmitter is contained at least partially within an integrated circuit.

21. The radio frequency transmitter as in claim 6, where said radio frequency transmitter is contained at least partially within an integrated circuit.

22. The apparatus as in claim 11, where said radio frequency transmitter is contained at least partially within an integrated circuit.

23. The radio frequency transmitter as in claim 16, where said radio frequency transmitter is contained at least partially within an integrated circuit.

24. The method as in claim 1, where the output of the variable gain element is configured to be connectable with a radio frequency input of the power amplifier, and where an input of the variable gain element is configured to be connectable with an output of a direct conversion mixer.

25. The method as in claim 24, where at least the direct conversion mixer and the variable gain element comprise a part of an integrated circuit.

26. The radio frequency transmitter as in claim 6, where the output of the variable gain amplifier is configured to be connectable with a radio frequency input of the power amplifier, and where an input of the variable gain amplifier is configured to be connectable with an output of a direct conversion mixer.

27. The radio frequency transmitter as in claim 26, where at least the direct conversion mixer and the variable gain amplifier comprise a part of an integrated circuit.

28. The apparatus as in claim 11, where the output of the variable gain circuit is configured to be connectable with a radio frequency input of the power amplifier, and where an input of the variable gain circuit is configured to be connectable with an output of a direct conversion mixer.

29. The apparatus as in claim 28, where at least the direct conversion mixer and the variable gain circuit comprise a part of an integrated circuit.

30. The radio frequency transmitter as in claim 16, where the output means of the variable gain means is configured to be connectable with a radio frequency input means of the power amplifier means, and where an input of the variable gain means is configured to be connectable with output means of a direct conversion mixer.

31. The radio frequency transmitter as in claim 30, where at least the direct conversion mixer and the variable gain means comprise a part of an integrated circuit.

* * * * *

UNITED STATES PATENT AND TRADEMARK OFFICE
CERTIFICATE OF CORRECTION

PATENT NO. : 7,532,680 B2  Page 1 of 1
APPLICATION NO. : 11/320181
DATED : May 12, 2009
INVENTOR(S) : Vayrynen et al.

It is certified that error appears in the above-identified patent and that said Letters Patent is hereby corrected as shown below:

In Claim 7, Column 6, line 44, delete "a power" and replace with --a programmable power--.

In Claim 8, Column 6, line 48, delete "the power" and replace with --the programmable power--.

In Claim 9, Column 6, line 52, delete "the power" and replace with --the programmable power--.

Signed and Sealed this

Thirtieth Day of June, 2009

JOHN DOLL
*Acting Director of the United States Patent and Trademark Office*